US012685067B2

(12) United States Patent
Inoue et al.

(10) Patent No.: US 12,685,067 B2
(45) Date of Patent: Jul. 14, 2026

(54) WAFER PROCESSING METHOD AND WAFER PROCESSING SYSTEM

(71) Applicant: DISCO CORPORATION, Tokyo (JP)

(72) Inventors: Yuki Inoue, Tokyo (JP); Naoko Yamamoto, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 368 days.

(21) Appl. No.: 18/324,262

(22) Filed: May 26, 2023

(65) Prior Publication Data

US 2023/0395401 A1     Dec. 7, 2023

(30) Foreign Application Priority Data

Jun. 6, 2022    (JP) ................................. 2022-091773

(51) Int. Cl.
    H10P 72/00       (2026.01)
    B24B 7/22        (2006.01)
(52) U.S. Cl.
    CPC .......... H10P 72/0428 (2026.01); B24B 7/228 (2013.01); *H10P 72/0414* (2026.01)
(58) Field of Classification Search
    CPC ......... H01L 21/67092; H01L 21/67051; H01L 21/30625; H01L 21/185; H01L 21/67046; H01L 21/67219; H01L 24/94; H01L 2224/94; B24B 7/228; B24B 9/065; B24B 49/02; B24B 55/06; B24B 57/02; H10P 72/0428; H10P 72/0198; H10P 72/0412; H10P 72/0472; H10P 72/0414; H10P 10/12; H10P 52/402
    See application file for complete search history.

(56) References Cited

U.S. PATENT DOCUMENTS

| | | | | |
|---|---|---|---|---|
| 6,293,858 B1 * | 9/2001 | Kimura | ................... | B24B 37/32 |
| | | | | 451/446 |
| 6,629,874 B1 * | 10/2003 | Halley | ................... | B24B 37/04 |
| | | | | 451/6 |
| 6,790,763 B2 * | 9/2004 | Kondo | ................ | H01L 21/6723 |
| | | | | 257/E21.174 |
| 7,621,799 B2 * | 11/2009 | Sakairi | ................. | H10P 90/129 |
| | | | | 451/36 |
| 8,119,500 B2 * | 2/2012 | Yang | ................... | H01L 21/2007 |
| | | | | 438/455 |
| 8,445,360 B2 * | 5/2013 | Nakanishi | ............. | H01L 21/304 |
| | | | | 451/59 |
| 2024/0170451 A1 * | 5/2024 | De Buttet | ............... | H01L 24/94 |

FOREIGN PATENT DOCUMENTS

| | | | |
|---|---|---|---|
| JP | 10335195 A | | 12/1998 |
| JP | 2017183503 A | * | 10/2017 |
| JP | 2021068744 A | | 4/2021 |

OTHER PUBLICATIONS

Office Action issued in counterpart Japanese patent application No. 2022-091773, dated Jan. 6, 2026.

* cited by examiner

*Primary Examiner* — Dale E Page
*Assistant Examiner* — Quovaunda Jefferson
(74) *Attorney, Agent, or Firm* — Greer Burns & Crain Ltd.

(57)          ABSTRACT

A wafer processing method includes an outer edge removing step of removing an outer edge of a first wafer having a first wiring layer formed on a front surface thereof from the front surface, and a polishing step of polishing the first wiring layer on the front surface of the first wafer after the outer edge removing step.

4 Claims, 5 Drawing Sheets

WAFER PROCESSING METHOD AND WAFER PROCESSING SYSTEM

BACKGROUND OF THE INVENTION

Field of the Invention

The present invention relates to a wafer processing method and a wafer processing system.

Description of the Related Art

A method of forming a bonded wafer by joining a front surface of a first wafer and a front surface of a second wafer to each other has been known (for example, see JP 2021-068744A).

SUMMARY OF THE INVENTION

When a back surface of a wafer having a wiring layer formed on a front surface thereof is held by a holding table and edge trimming is performed to remove an outer edge of the wafer from the front surface, processing debris is liable to remain on the front surface of the wafer. In particular, in the case where the wiring layer being exposed on the front surface of the wafer is joined to another wafer after the edge trimming, a joint defect may occur if the processing debris produced at the time of the edge trimming adheres to the wiring layer.

Therefore, an object of the present invention is to provide a wafer processing method and a wafer processing system that are capable of removing processing debris adhering to a front surface of a wafer.

In accordance with an aspect of the present invention, there is provided a wafer processing method including an outer edge removing step of removing an outer edge of a first wafer having a first wiring layer formed on a front surface thereof from the front surface, and a polishing step of polishing the front surface of the first wafer after the outer edge removing step.

Preferably, the wafer processing method further includes a bonding step of bonding the first wafer and a second wafer having a second wiring layer formed on a front surface thereof to each other, and the first wiring layer and the second wiring layer are joined to each other in the bonding step.

Preferably, the wafer processing method further includes a back surface grinding step of grinding a back surface of the first wafer to a finish thickness after the bonding step, and a thickness removed from the front surface is deeper than the finish thickness of the first wafer in the outer edge removing step.

Preferably, the polishing step is wet polishing using a polishing liquid. Preferably, the polishing step is started in a state where a processing liquid supplied in the outer edge removing step remains on the front surface of the first wafer.

In accordance with another aspect of the present invention, there is provided a wafer processing system including a holding table that holds a back surface of a first wafer having a wiring layer formed on a front surface thereof, an outer edge removing unit that removes an outer edge of the first wafer held by the holding table from the front surface, a polishing unit that polishes the front surface of the first wafer with the outer edge removed by the outer edge removing unit, a cleaning unit that cleans the first wafer polished by the polishing unit, and a delivery unit that delivers the first wafer between the outer edge removing unit, the polishing unit, and the cleaning unit.

Preferably, the polishing unit includes a polishing pad that is brought into contact with the first wafer, and a polishing liquid supply unit that supplies a polishing liquid to a processing point.

Preferably, the polishing unit starts polishing in a state where a processing liquid supplied by the outer edge removing unit remains on the front surface of the first wafer.

The wafer processing method according to the present invention includes the polishing step that is performed after the outer edge removing step. Hence, it is possible to preferably remove the processing debris adhering on the first wiring layer, before the processing debris that has stuck on the first wiring layer in the outer edge removing step is dried and fixed on the first wiring layer. In addition, the processing debris adhering to the first wiring layer is removed in the polishing step, and an abnormal oxidized layer or a corroded layer is removed to expose and bond the surface which is not abnormally oxidized or corroded. Hence, it is possible to reduce a possibility that a joint defect is caused by the abnormal oxidized layer and the corroded layer of the first wiring layer.

In addition, since the outer edge of the first wafer is removed in the outer edge removing step to form the trimming groove deeper than the finish thickness before the back surface grinding step, it is possible to prevent the first wafer from being broken due to the formation of a sharp edge at the time of performing the back surface grinding step. Further, since the polishing processing performed by the polishing unit in the polishing step is wet polishing using the polishing liquid supplied to the processing point from the polishing liquid supply unit, an abnormal oxidized layer or a corroded layer formed on the surface on which the first wiring layer is exposed can be removed by the polishing liquid, and the surface which is not abnormally oxidized or corroded can be exposed, so that it is possible to reduce a possibility that a joint defect between the first wiring layer and the second wiring layer of the second wafer is caused by the abnormal oxidized layer or the corroded layer of the first wiring layer.

The wafer processing system according to the present invention includes the outer edge removing unit for removing the outer edge of the first wafer, the polishing unit for polishing the first wiring layer, and the delivery unit for delivering the first wafer between the outer edge removing unit and the polishing unit. Hence, it is possible to perform the wafer processing method according to the present invention described above, and the first wiring layer can be polished by the polishing unit in a state where the processing liquid supplied when the outer edge is removed by the outer edge removing unit remains on the first wiring layer of the first wafer. Therefore, the processing debris adhering on the first wiring layer can preferably be removed before the processing debris that has stuck on the first wiring layer upon the removal of the outer edge is dried and fixed on the first wiring layer. Accordingly, it is possible to reduce a possibility that a joint defect between the first wiring layer and the second wiring layer of the second wafer is caused by the processing debris.

The above and other objects, features and advantages of the present invention and the manner of realizing them will become more apparent, and the invention itself will best be understood from a study of the following description and appended claims with reference to the attached drawings
showing a preferred embodiment of the invention.

DETAILED DESCRIPTION OF THE
PREFERRED EMBODIMENT

Hereinafter, an embodiment of the present invention will
be described in detail with reference to the drawings. The
present invention is not limited to the details of the embodi-
ment in the following description. In addition, the constitu-
tional elements described below include those that can easily
be assumed by a person skilled in the art and those that are
substantially the same as the constitutional elements
described below. Further, the configurations described
below can appropriately be combined with one another.
Moreover, various omissions, substitutions, or changes of
the configurations can be made without departing from the
gist of the present invention.

Figure 1:
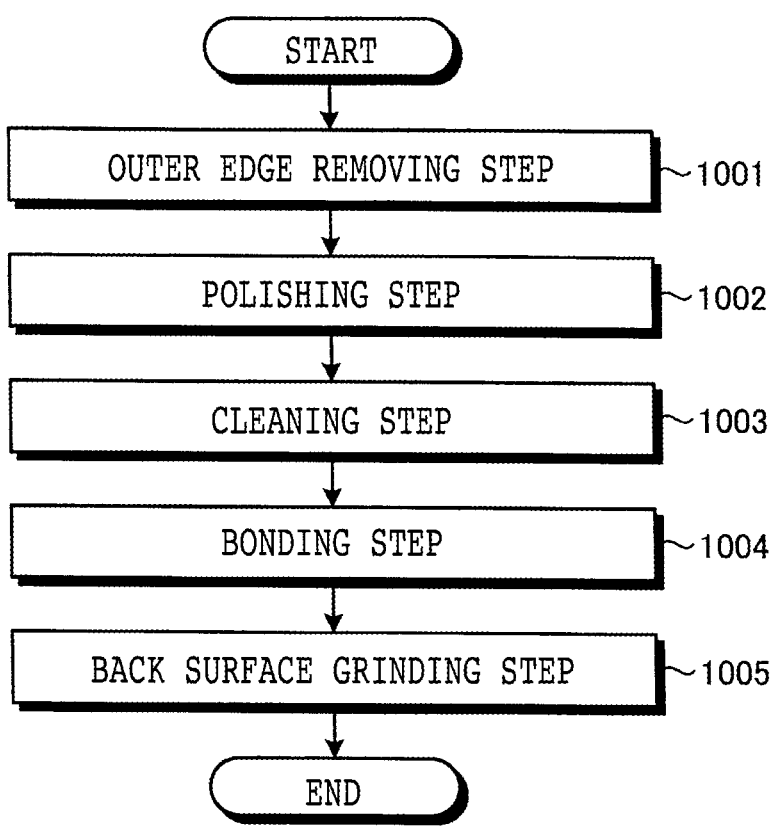
FIG. 1 is a flowchart illustrating a processing procedure of
a wafer processing method according to an embodiment.

A wafer processing method and a wafer processing sys-
tem 1 according to an embodiment of the present invention
will be described on the basis of the drawings. FIG. 1 is a
flowchart illustrating a processing procedure of the wafer
processing method according to the embodiment. The wafer
processing method according to the embodiment includes an
outer edge removing step 1001, a polishing step 1002, a
cleaning step 1003, a bonding step 1004, and a back surface
grinding step 1005 as illustrated in FIG. 1.

Figure 2:
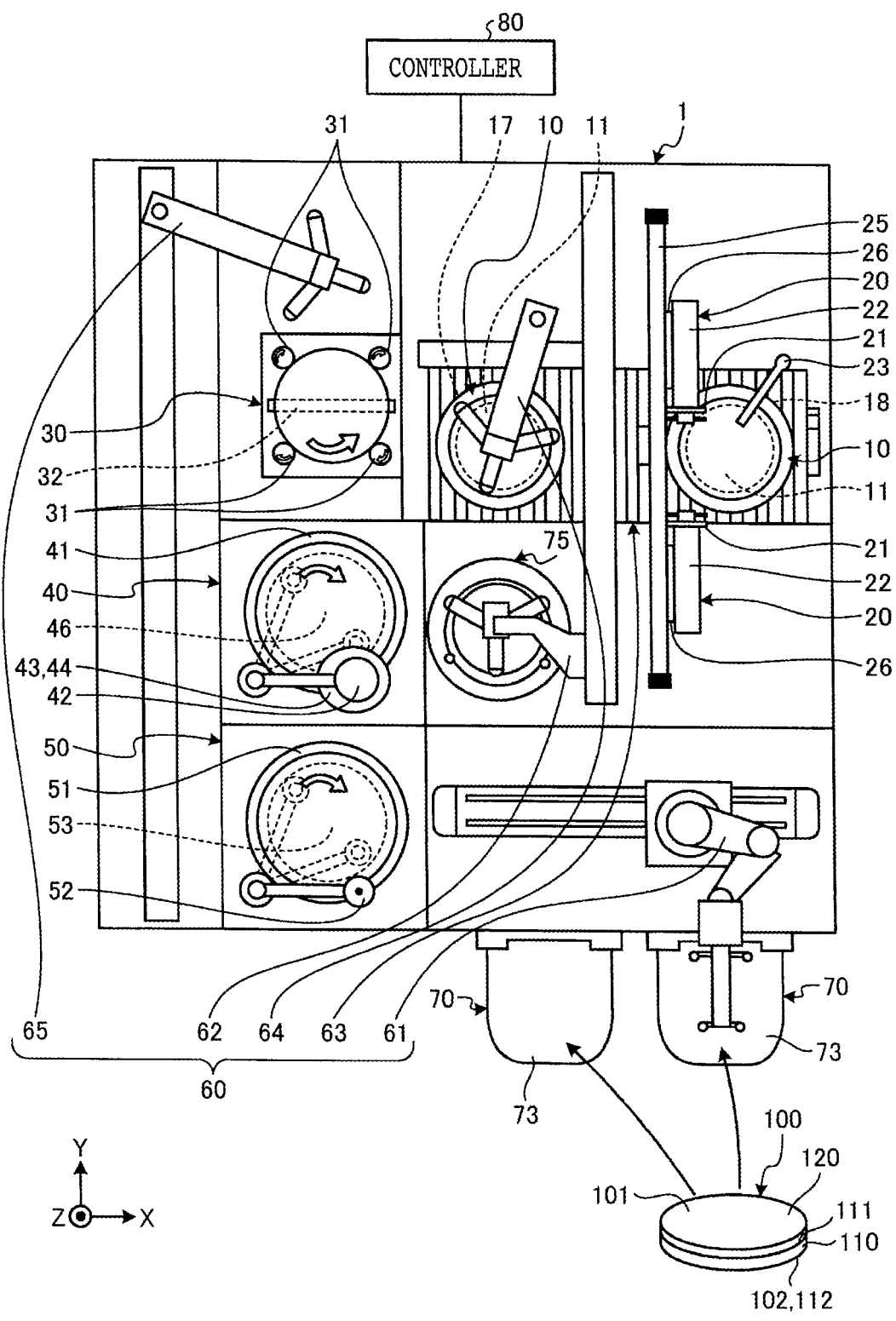
FIG. 2 is a top view illustrating a configuration example
of a wafer processing system according to the embodiment.

FIG. 2 is a top view illustrating a configuration example
of the wafer processing system 1 according to the embodi-
ment. The outer edge removing step 1001, the polishing step
1002, and the cleaning step 1003 of the wafer processing
method according to the embodiment are performed by, for
example, the wafer processing system 1 illustrated in FIG. 2.
As illustrated in FIG. 2, the wafer processing system 1
includes a holding table 10, an outer edge removing unit 20,
a back surface cleaning unit 30, a polishing unit 40, a
cleaning unit 50, a delivery unit 60, cassette mounting tables
70, a temporary placing table 75, and a controller 80.

A first wafer 100 to be processed by the wafer processing
method and the wafer processing system 1 according to the
embodiment has a first substrate 110 and a first wiring layer
120 laminated on the first substrate 110. The first substrate
110 is, for example, a disk-shaped semiconductor wafer or
optical device wafer whose base material is silicon, sap-
phire, silicon carbide (SiC), gallium arsenic, glass, or the
like, or a disk-shaped substrate made of glass, ceramics,
resin, metal, or the like. On a front surface 111 of the first
substrate 110 of the first wafer 100, for example, devices
each including the first wiring layer 120 of a chip size are
formed in respective regions demarcated by a plurality of scheduled division lines formed in a lattice shape. The first
wiring layer 120 is formed of, for example, metal such as
copper (Cu). Thus, a front surface 101 of the first wafer 100
is a surface on which the first wiring layer 120 is exposed.
A back surface 102 of the first wafer 100 corresponds to a
back surface 112 (exposed surface) of the first substrate 110
in the embodiment, but is not limited to this in the present
invention. The back surface 102 of the first wafer 100 may
be supported by a support substrate, an adhesive tape, or the
like, which is not illustrated.

Figure 3:
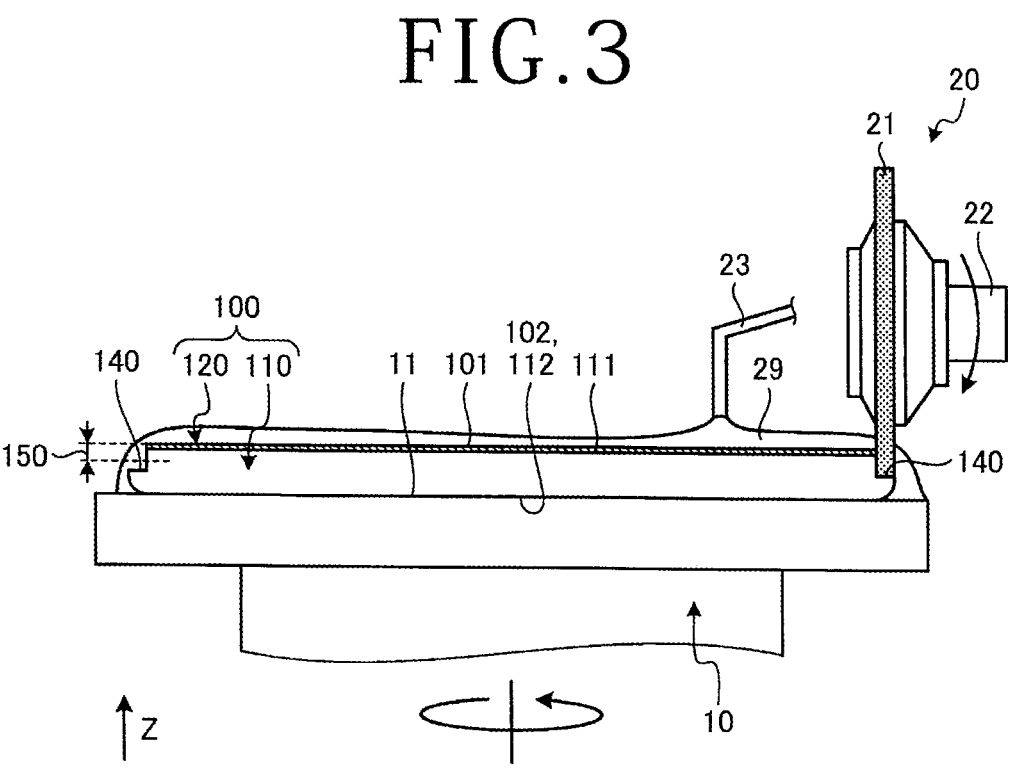
FIG. 3 is a cross-sectional view illustrating a holding table
and an outer edge removing unit of FIG. 2.

FIG. 3 is a cross-sectional view for explaining the holding
table 10 and the outer edge removing unit 20 of FIG. 2. The
holding table 10 is what is called a chuck table in the
embodiment and includes a disk-shaped frame body with a
recess formed therein and a disk-shaped adsorption part
fitted in the recess. The adsorption part of the holding table
10 has a porous portion formed of porous ceramics or the
like including a number of porous holes, and is connected to
a vacuum suction source, which is not illustrated, through a
vacuum suction path, which is not illustrated. An upper
surface of the adsorption part of the holding table 10 serves
as a holding surface 11 for holding under suction the first
wafer 100 mounted thereon, by a negative pressure intro-
duced from the vacuum suction source. In the embodiment,
as illustrated in FIG. 3, the first wafer 100 is mounted on the
holding surface 11 with the front surface 101 facing upward,
and the back surface 102 of the mounted first wafer 100 is
held under suction. The holding surface 11 and an upper
surface of the frame body of the holding table 10 are
arranged on the same plane and formed parallel to the XY
plane which is a horizontal plane.

The holding table 10 is provided movably in an X-axis
direction parallel to the horizontal direction between a
loading/unloading area 17 and a processing area 18 by a
third delivery part 63 (see FIG. 2) of the delivery unit 60, and
is rotatable about a Z-axis perpendicular to the horizontal
plane (XY plane) and parallel to the vertical direction by a
rotary driving source, which is not illustrated. Here, the
loading/unloading area 17 is a region where the first wafer
100 is loaded or unloaded by a second delivery part 62 and
a fourth delivery part 64 of the delivery unit 60. In addition,
the processing area 18 is a region where the first wafer 100
is subjected to cutting processing by the outer edge remov-
ing unit 20.

As illustrated in FIG. 2 and FIG. 3, the outer edge
removing unit 20 is disposed in the processing area 18 and
includes a spindle 22 having a cutting blade 21 mounted at
the tip end thereof and a processing liquid supply part 23.
The outer edge removing unit 20 performs the cutting
processing on the first wafer 100 held by the holding table
10 positioned at the processing area 18. The outer edge
removing unit 20 is provided movably in a Y-axis direction
parallel to the horizontal direction and perpendicular to the
X-axis direction by a Y-axis direction moving unit 25, and
is movable in a Z-axis direction by a Z-axis direction
moving unit 26.

As illustrated in FIG. 3, the outer edge removing unit 20
performs outer edge removing processing (what is called
edge trimming processing) as follows. Specifically, while
the processing liquid supply part 23 supplies a processing
liquid 29 onto the front surface 101 (on which the first
wiring layer 120 is exposed) of the first wafer 100, the
cutting blade 21 to which the rotational motion about the
axis parallel to the Y-axis direction is applied by the rota-
tional motion of the spindle 22 is aligned to a position where
the outer edge of the first wafer 100 held by the holding table
10 is cut from the front surface 101 to a predetermined depth deeper than a finish thickness 150 (see FIG. 3 and FIG. 7) of the first wafer 100. Then, the rotary driving source is controlled to rotate and move the holding table holding the first wafer 100 thereon about the Z-axis. Thus, the whole circumference of the outer edge of the first wafer 100 is annularly cut and removed deeper than the finish thickness 150 of the first wafer 100, forming a trimming groove 140. Here, the processing liquid 29 is, for example, pure water. In addition, the finish thickness 150 of the first wafer 100 refers to the thickness of the first wafer 100 that has undergone the back surface grinding step 1005, and is thinner than, for example, the total thickness of the first substrate 110 and the first wiring layer 120 of the first wafer 100 that is yet to be subjected to the back surface grinding step 1005, in the embodiment. As illustrated in FIG. 2, the wafer processing system 1 includes two outer edge removing units 20, that is, the wafer processing system 1 is a two-spindle dicer or what is called a facing dual-type processing system.

As illustrated in FIG. 2, the back surface cleaning unit 30 has wafer support parts 31 and a cleaning part 32. In the embodiment, a plurality of wafer support parts 31 are provided (in the example illustrated in FIG. 2, four wafer support parts 31 are disposed at intervals). The plurality of wafer support parts 31 clamp and support an outer peripheral surface of the edge of the first wafer 100 from the outer peripheral side. In addition, the plurality of wafer support parts 31 are rotated in conjunction with one another, so that the first wafer 100 can be rotated. The cleaning part 32 is disposed below the wafer support parts 31 while facing upward, and is brought into contact with the back surface 102 of the first wafer 100 supported by the wafer support parts 31, to clean the back surface 102. The cleaning part 32 is formed of a deformable material softer than the first substrate 110, such as a sponge or a brush, so that a surface of the cleaning part 32 can be brought into contact with the first substrate 110 by being deformed in correspondence with the first substrate 110.

Figure 4:
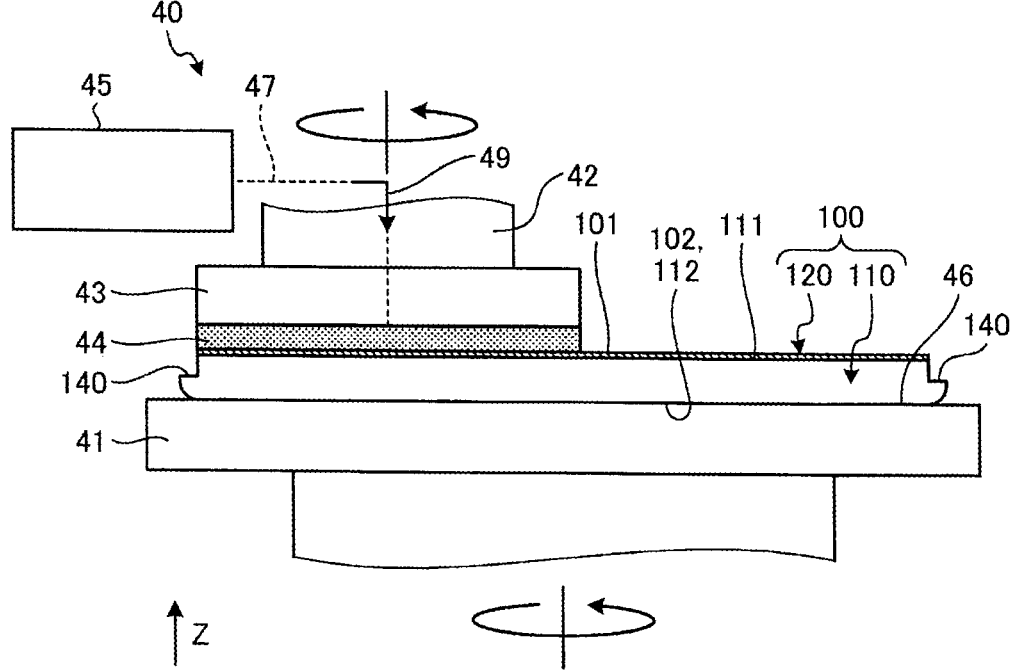
FIG. 4 is a cross-sectional view illustrating a polishing
unit of FIG. 2.

FIG. 4 is a cross-sectional view for explaining the polishing unit 40 of FIG. 2. The polishing unit 40 includes a holding table 41, a spindle 42, a polishing pad 44 attached to a mount 43, and a polishing liquid supply unit 45 as illustrated in FIG. 2 and FIG. 4. The holding table 41 includes an adsorption part and a porous portion similar to those of the holding table 10, and holds under suction, on a holding surface 46 thereof, the back surface 102 of the first wafer 100 mounted thereon with the front surface 101 facing upward. The holding table 41 is rotatable about the Z-axis by a rotary driving source, which is not illustrated.

The cylindrical spindle 42 has a lower end to which the disk-shaped mount 43 is fixed, and the circular polishing pad 44 is mounted on a lower surface of the mount 43. The spindle 42 rotates about the axis parallel to the Z-axis direction which is the vertical direction. The polishing unit 40 performs polishing processing as follows. Specifically, the rotational motion about the axis parallel to the Z-axis direction is applied to the mount 43 and the polishing pad 44 by the rotational motion of the spindle 42, and the polishing pad 44 is pressed by being brought into contact with the front surface 101 (on which the first wiring layer 120 is exposed) of the first wafer 100 held by the holding table 41, to polish the first wiring layer 120 with the polishing pad 44. The polishing liquid supply unit 45 supplies a polishing liquid 49 to a processing point through a polishing liquid flow path 47 extending in the Z-axis direction from the inside of the mount 43 to the inside of the spindle 42. Here, the processing point refers to any position within the region where the polishing processing is performed with use of the polishing pad 44 on the surface of the first wafer 100 on which the first wiring layer 120 is exposed.

The spindle 42 is provided movably between a polishing position where the mount 43 fixed to the lower end of the spindle 42 and the polishing pad 44 mounted to the mount 43 perform the polishing processing on the first wafer 100 held by the holding table 41 and a loading/unloading position where the spindle 42 retreats from above the holding table 41 to allow the first wafer 100 to be loaded into and unloaded from the holding table 41.

The polishing pad 44 formed of, for example, a nonwoven fabric or an elastic resin such as urethane is used in the embodiment. In addition, the polishing pad 44 may contain or may not contain fixed abrasive grains. In the embodiment, the polishing unit 40 may perform wet polishing on the first wiring layer 120 with the use of the polishing pad 44 while supplying the polishing liquid 49 from the polishing liquid supply unit 45, or may perform dry polishing on the first wiring layer 120 with the use of the polishing pad 44 without supplying the polishing liquid 49 from the polishing liquid supply unit 45. As the wet polishing, the polishing unit 40 may polish the first wiring layer 120 with the polishing pad 44 while supplying slurry containing abrasive grains as the polishing liquid 49 from the polishing liquid supply unit 45, may polish the first wiring layer 120 with the polishing pad 44 containing fixed abrasive grains while supplying pure water as the polishing liquid 49 from the polishing liquid supply unit 45. Alternately, the polishing unit 40 may perform chemical mechanical polishing (CMP) with the use of the polishing pad 44 while supplying an alkaline polishing liquid as the polishing liquid 49 from the polishing liquid supply unit 45.

Figure 5:
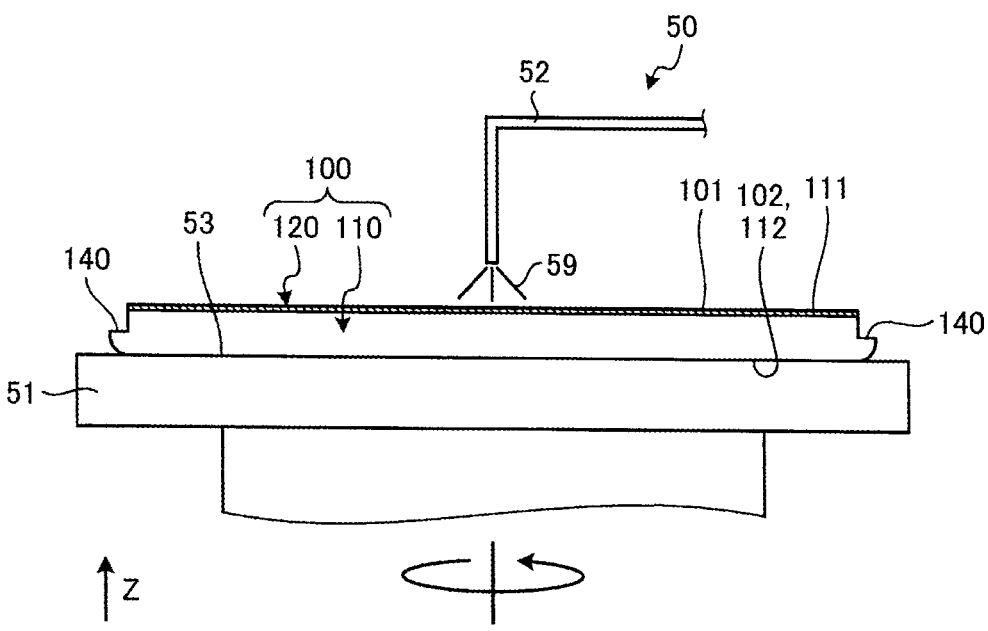
FIG. 5 is a cross-sectional view illustrating a cleaning unit
of FIG. 2.

FIG. 5 is a cross-sectional view for explaining the cleaning unit 50 of FIG. 2. The cleaning unit 50 includes a spinner table 51 and a cleaning liquid supply nozzle 52 as illustrated in FIG. 2 and FIG. 5. The spinner table 51 includes an adsorption part and a porous portion similar to those of the holding tables 10 and 41, and holds under suction, on a holding surface 53, the back surface 102 of the first wafer 100 mounted with the front surface 101 facing upward. The spinner table 51 is rotatable about the Z-axis by a rotary driving source, which is not illustrated. The cleaning liquid supply nozzle 52 supplies a cleaning liquid 59 to the front surface 101 of the first wafer 100 held by the spinner table 51. The cleaning liquid 59 is, for example, pure water, a mixed fluid of pure water and air, or the like. The cleaning unit 50 performs a cleaning operation to clean the first wiring layer 120 with the cleaning liquid 59 in such a manner that, while rotating the spinner table 51, the cleaning unit 50 supplies the cleaning liquid 59 from the cleaning liquid supply nozzle 52 to the front surface 101 (on which the first wiring layer 120 is exposed) of the first wafer 100 held by the spinner table 51.

The cleaning liquid supply nozzle 52 is provided movably between a cleaning position where the cleaning operation is performed on the first wafer 100 held by the spinner table 51 and a loading/unloading position where the cleaning liquid supply nozzle 52 retreats from above the spinner table 51 to allow the first wafer 100 to be loaded into and unloaded from the spinner table 51.

The delivery unit 60 includes a first delivery part 61, the second delivery part 62, the third delivery part 63, the fourth delivery part 64, and a fifth delivery part 65 as illustrated in FIG. 2. The first delivery part 61 is disposed in a region between the cassettes 73 mounted on the cassette mounting tables the temporary placing table 75, and the cleaning unit and delivers the first wafer 100 between the cassettes 73 mounted on the cassette mounting tables 70, the temporary placing table 75, and the spinner table 51 of the cleaning unit 50. The second delivery part 62 is provided movably between the temporary placing table 75 and the loading/unloading area 17, and delivers the first wafer 100 between the temporary placing table 75 and the holding table 10 positioned at the loading/unloading area 17.

The third delivery part 63 is disposed in a region over the loading/unloading area 17 and the processing area 18, and delivers the first wafer 100 held by the holding table 10, by moving the holding table 10 between the loading/unloading area 17 and the processing area 18. The fourth delivery part 64 is provided movably between the loading/unloading area 17 and the back surface cleaning unit 30, and delivers the first wafer 100 between the holding table 10 positioned at the loading/unloading area 17 and the back surface cleaning unit 30. The fifth delivery part 65 is provided movably between the back surface cleaning unit 30, the polishing unit 40, and the cleaning unit 50, and delivers the first wafer 100 between the back surface cleaning unit 30, the holding table 41 of the polishing unit 40, and the spinner table 51 of the cleaning unit 50.

Thus, the delivery unit 60 delivers the first wafer 100 between the cassettes 73 mounted on the cassette mounting tables 70, the temporary placing table the outer edge removing unit 20 disposed in the processing area 18, the back surface cleaning unit 30, the holding table 41 of the polishing unit 40, and the spinner table 51 of the cleaning unit 50 by the first delivery part 61, the second delivery part 62, the third delivery part 63, the fourth delivery part 64, and the fifth delivery part 65.

Each of the cassette mounting tables 70 is a mounting table on which the cassette 73 housing one or more first wafers 100 is mounted, and raises and lowers the mounted cassette 73 in the Z-axis direction. The temporary placing table 75 is a table on which the first wafer 100 taken out of the cassette 73 mounted on the cassette mounting table 70 is temporarily placed to adjust the center position thereof.

The controller 80 controls the motion of each constitutional element of the wafer processing system 1 to cause the wafer processing system 1 to perform operation processing of the outer edge removing step 1001, the polishing step 1002, and the cleaning step 1003 in the wafer processing method according to the embodiment. The controller 80 includes a computer system in the embodiment. The computer system included in the controller 80 has a computation processing device having a microprocessor such as a central processing unit (CPU), a storage device having a memory such as a read only memory (ROM) or a random access memory (RAM), and an input/output interface device. The computation processing device of the controller 80 performs computation processing according to a computer program stored in the storage device of the controller 80, and outputs a control signal for controlling the wafer processing system 1 to each constitutional element of the wafer processing system 1 through the input/output interface device of the controller 80.

In the wafer processing method according to the embodiment, before the outer edge removing step 1001 is performed, the first delivery part 61 and the second delivery part 62 load the first wafer 100 from the cassette 73 mounted on the cassette mounting table 70 onto the holding table 10 positioned at the loading/unloading area 17 through the temporary placing table 75, the holding table 10 holds under suction, on the holding surface 11, the first wafer 100 unloaded onto the holding table 10, and the third delivery part 63 positions the holding table 10 holding the first wafer 100 thereon to the processing area 18.

The outer edge removing step 1001 is a step of removing, from the front surface 101, the outer edge of the first wafer 100 having the first wiring layer 120 formed on the front surface 101. In the outer edge removing step 1001, as illustrated in FIG. 3, the outer edge removing unit 20 performs outer edge removing processing on the first wafer 100 held by the holding table 10 positioned at the processing area 18, to form the trimming groove 140 deeper than the finish thickness 150. In the outer edge removing step 1001, processing debris is generated when the outer edge of the first wafer 100 is processed from the front surface 101 by the cutting blade 21 and adheres onto the front surface 101 (on which the first wiring layer 120 is exposed) of the first wafer 100 in some cases.

In the wafer processing method according to the embodiment, after the outer edge removing step 1001 is performed but before the polishing step 1002 is performed, the third delivery part 63 positions the holding table 10 holding the first wafer 100 with the trimming groove 140 formed in the outer edge removing step 1001, to the loading/unloading area 17, and the fourth delivery part 64 delivers the first wafer 100 to the back surface cleaning unit 30 from the holding table positioned at the loading/unloading area 17. Then, the back surface cleaning unit 30 causes the wafer support parts 31 to support the first wafer 100 delivered to the back surface cleaning unit 30 and causes the cleaning part 32 to clean the back surface 102 of the first wafer 100 supported by the wafer support parts 31. Then, the fifth delivery part 65 delivers the first wafer 100 with the back surface 102 cleaned by the back surface cleaning unit 30, from the back surface cleaning unit 30 onto the holding table 41 of the polishing unit 40. At this time, the first wafer 100 is delivered while a state where the processing liquid 29 supplied in the outer edge removing step 1001 remains on the front surface 101 (on which the first wiring layer 120 is exposed) of the first wafer 100, that is, a state where the first wiring layer 120 is not completely dried, is maintained.

The polishing step 1002 is a step of polishing the front surface 101 (on which the first wiring layer 120 is exposed) of the first wafer 100 after the outer edge removing step 1001 is performed. In the polishing step 1002, the polishing unit 40 performs the polishing processing on the first wafer 100 held by the holding table 41, as illustrated in FIG. 4. In the polishing step 1002, the amount of polishing of the front surface 101 (on which the first wiring layer 120 is exposed) of the first wafer 100 is in the range of 3 nm or more to 5 nm or less.

In the polishing step 1002, the polishing processing is started in the state where the processing liquid 29 supplied in the outer edge removing step 1001 remains on the front surface 101 (on which the first wiring layer 120 is exposed) of the first wafer 100. Since the polishing processing is performed in this way in the polishing step 1002, it is possible to remove such processing debris that is adhering on the first wiring layer 120 and that is difficult to be removed even when being cleaned with a mixed fluid of pure water and air supplied thereto or cleaned with the use of a sponge or a brush. In addition, since the polishing processing is started in the polishing step 1002 in the state where the processing liquid 29 remains on the front surface 101 (on which the first wiring layer 120 is exposed) of the first wafer 100, the processing debris can preferably be removed before the processing debris that has stuck on the first wiring layer 120 is dried and fixed on the first wiring layer 120.

In addition, since the polishing processing performed by the polishing unit 40 in the polishing step 1002 is wet polishing with the use of the polishing liquid 49 supplied to the processing point from the polishing liquid supply unit 45 in this embodiment, an abnormal oxidized layer or a corroded layer formed on the surface on which the first wiring layer 120 is exposed can be removed by the polishing liquid 49 to expose the surface which is not abnormally oxidized or corroded.

In the wafer processing method according to the embodiment, after the polishing step 1002 is performed but before the cleaning step 1003 is performed, the fifth delivery part 65 delivers the first wafer 100 which has been polished in the polishing step 1002, from the holding table 41 of the polishing unit 40 onto the spinner table 51 of the cleaning unit 50.

The cleaning step 1003 is a step of cleaning the front surface 101 (on which the first wiring layer 120 is exposed) of the first wafer 100 polished in the polishing step 1002. In the cleaning step 1003, as illustrated in FIG. 5, the cleaning unit 50 performs the cleaning operation on the first wafer 100 held by the spinner table 51, to remove the polishing debris generated in the polishing step 1002 and the remaining polishing liquid 49 from the front surface 101 (on which the first wiring layer 120 is exposed) of the first wafer 100.

In the wafer processing method according to the embodiment, after the cleaning step 1003 is performed but before the bonding step 1004 is performed, the first delivery part 61 delivers the first wafer 100 which has been cleaned in the cleaning step 1003, from the spinner table 51 of the cleaning unit 50 into the cassette 73 mounted on the cassette mounting table 70, and moves the first wafer 100 loaded into the cassette 73 to a predetermined bonding apparatus for performing the bonding step 1004. In addition, before the bonding step 1004 is performed, a second wafer 200 (see FIG. 6) to be bonded to the first wafer 100 that has undergone the outer edge removing step 1001, the polishing step 1002, and the cleaning step 1003 is prepared in the bonding step 1004.

Figure 6:
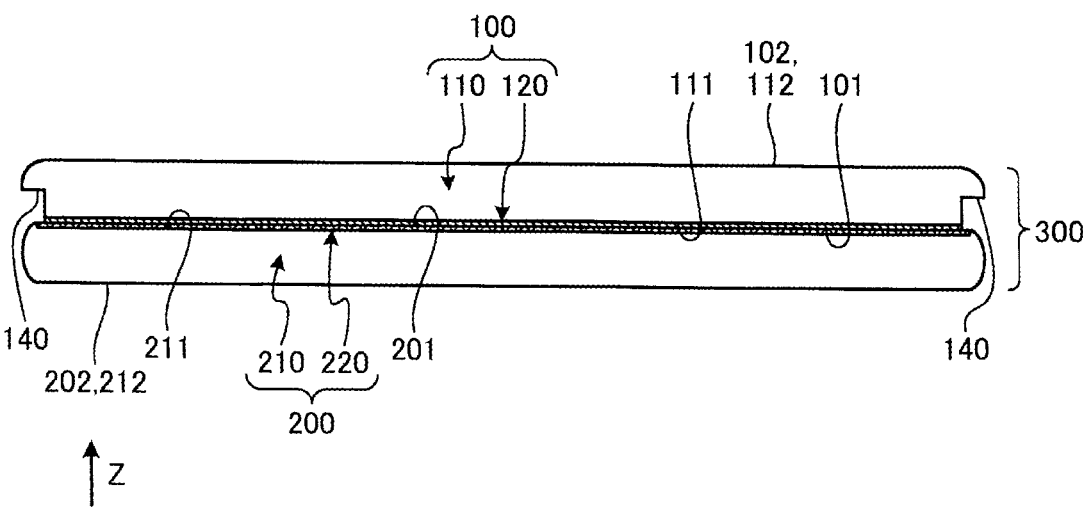
FIG. 6 is a cross-sectional view illustrating a bonding step
of FIG. 1.

FIG. 6 is a cross-sectional view for explaining the bonding step 1004 of FIG. 1. The second wafer 200 prepared before the bonding step 1004 is performed includes a second substrate 210 and a second wiring layer 220 as illustrated in FIG. 6. The second substrate 210 has a flat front surface 211 on which the second wiring layer 220 is formed. Thus, a front surface 201 of the second wafer 200 is a surface on which the second wiring layer 220 is exposed, and a back surface 202 of the second wafer 200 corresponds to a back surface 212 (exposed surface) of the second substrate 210. It is preferable that an abnormal oxidized layer or a corroded layer formed on the surface of the second wafer 200 on which the second wiring layer 220 is exposed be removed through steps similar to the polishing step 1002 and the cleaning step 1003 described above and that the surface which is not abnormally oxidized or corroded be exposed and cleaned.

The bonding step 1004 is a step of bonding the first wafer 100 which has been polished in the polishing step 1002 and the first wiring layer 120 of which has been cleaned in the cleaning step 1003, to the second wafer 200 having the second wiring layer 220 formed on the front surface 211 of the second substrate 210. In the bonding step 1004, for example, the first wafer 100 is held from the back surface 102 side, and the second wafer 200 is held from the back surface 202 side. Then, the surface of the first wafer 100 on which the first wiring layer 120 is exposed and the surface of the second wafer 200 on which the second wiring layer 220 is exposed are made to face each other and brought close to each other after being aligned with each other in the surface direction, so that the surface on which the first wiring layer 120 is exposed and the surface on which the second wiring layer 220 is exposed are brought into contact with and joined to each other as illustrated in FIG. 6. With the first wiring layer 120 and the second wiring layer 220 joined together in this way, a bonded wafer 300 in which the first wafer 100 and the second wafer 200 are bonded to each other is obtained. In the bonding step 1004, the surface on which the first wiring layer 120 is exposed and the surface on which the second wiring layer 220 is exposed may directly be brought into contact and joined to each other, or may indirectly be joined to each other through an electrically conductive adhesive. With the first wiring layer 120 and the second wiring layer 220 joined together in the bonding step 1004, the first wiring layer 120 and the second wiring layer 220 are electrically connected together.

Figure 7:
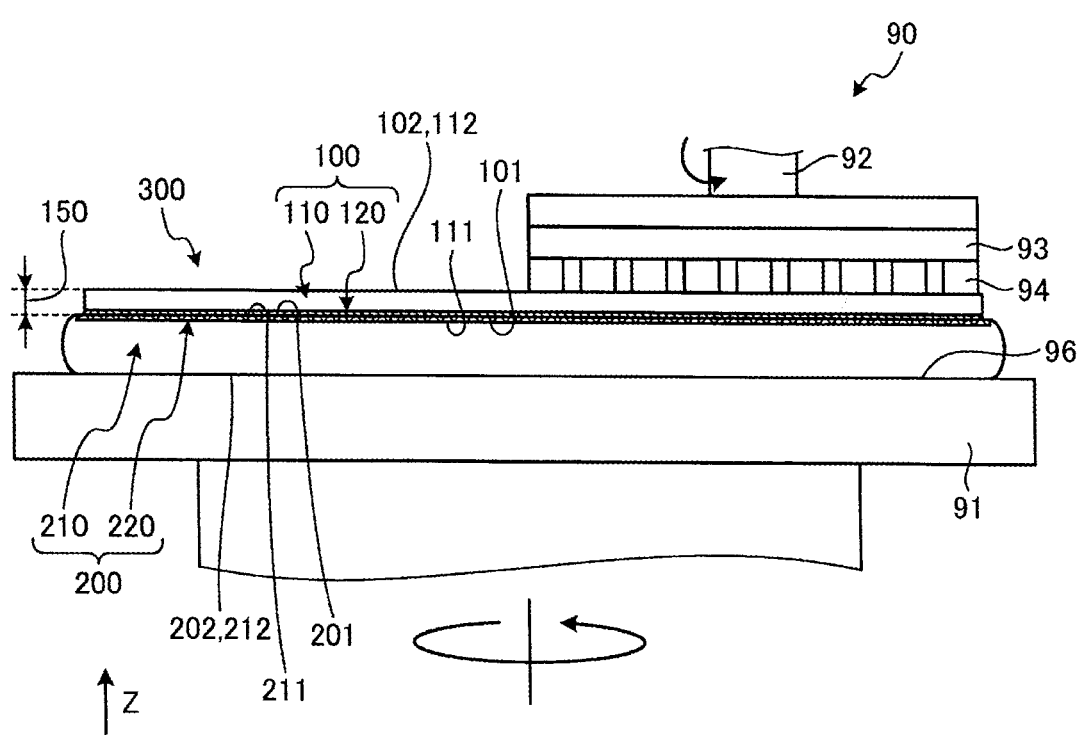
FIG. 7 is a cross-sectional view illustrating a back surface
grinding step of FIG. 1.

FIG. 7 is a cross-sectional view for explaining the back surface grinding step 1005 of FIG. 1. The back surface grinding step 1005 is a step of grinding the back surface 102 of the first wafer 100 to the finish thickness 150 after the bonding step 1004 is performed. The back surface grinding step 1005 is performed by, for example, a grinding apparatus 90 illustrated in FIG. 7.

As illustrated in FIG. 7, the grinding apparatus 90 for performing the back surface grinding step 1005 includes a holding table 91, a spindle 92, and a grinding wheel 93 with grinding stones 94 annularly arranged thereon. The holding table 91 includes an adsorption part and a porous portion similar to those of the holding tables 10 and 41, and holds under suction, on a holding surface 96 thereof, the back surface 202 of the second wafer 200 of the bonded wafer 300 mounted with the back surface 102 of the first wafer 100 facing upward. The holding table 91 is rotatable about the Z-axis by a rotary driving source, which is not illustrated. The cylindrical spindle 92 has a lower end to which the grinding wheel 93 is mounted with the grinding stones 94 facing downward. The spindle 92 rotates about the axis parallel to the Z-axis direction. The spindle 92 is provided movably in the Z-axis direction by a grinding feed unit, which is not illustrated.

In the back surface grinding step 1005, as illustrated in FIG. 7, grinding processing is performed in such a manner that the rotational motion about the axis parallel to the Z-axis direction is applied to the grinding wheel 93 of the grinding apparatus 90 by the rotational motion of the spindle 92 and that the grinding stones 94 of the grinding wheel 93 are pressed by being brought into contact with the back surface 102 of the first wafer 100 of the bonded wafer 300 held by the holding table 91 located below the grinding stones 94, grinding the first wafer 100 to the finish thickness 150 by the grinding stones 94.

Since the outer edge of the first wafer 100 is removed in the outer edge removing step 1001 to form the trimming groove 140 deeper than the finish thickness 150 before the back surface grinding step 1005 is performed, it is possible to prevent the first substrate 110 from being broken due to the formation of a sharp edge at the time of performing the back surface grinding step 1005.

The wafer processing system 1 according to the embodiment has the configuration as described above and includes the outer edge removing unit 20 for removing the outer edge of the first wafer 100, the polishing unit for polishing the first wiring layer 120, and the delivery unit 60 (the third delivery part 63, the fourth delivery part 64, and the fifth delivery part 65) for delivering the first wafer 100 between the outer edge removing unit 20 and the polishing unit 40. Hence, it is possible to perform the wafer processing method according to the embodiment such that the first wiring layer 120 is polished by the polishing unit 40 in the state where the processing liquid 29 supplied when the outer edge is removed by the outer edge removing unit 20 remains on the first wiring layer 120 of the first wafer 100. Therefore, according to the embodiment, the wafer processing system 1 and the wafer processing method performed by the wafer processing system 1 produce the following effect. That is, such processing debris that is adhering on the first wiring layer 120 and that is difficult to be removed even when being cleaned with a mixed fluid of pure water and air supplied thereto or cleaned with the use of a sponge or a brush can preferably be removed before the processing debris that has stuck on the first wiring layer 120 upon the removal of the outer edge is dried and fixed on the first wiring layer 120. Accordingly, it is possible to reduce a possibility that a joint defect between the first wiring layer 120 and the second wiring layer 220 of the second wafer 200 is caused by the processing debris.

In addition, in the wafer processing system 1 and the wafer processing method according to the embodiment, since the polishing processing performed by the polishing unit 40 in the polishing step 1002 is wet polishing using the polishing liquid 49 supplied to the processing point from the polishing liquid supply unit 45, an abnormal oxidized layer or a corroded layer formed on the surface on which the first wiring layer 120 is exposed can be removed by the polishing liquid 49, and the surface which is not abnormally oxidized or corroded can be exposed, so that it is possible to reduce a possibility that a joint defect between the first wiring layer 120 and the second wiring layer 220 of the second wafer 200 is caused by the abnormal oxidized layer or the corroded layer of the first wiring layer 120.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method comprising:
an outer edge removing step of removing an outer edge of a first wafer having a first wiring layer formed on a front surface thereof from the front surface;
a polishing step of polishing the front surface of the first wafer after the outer edge removing step; and
wherein the polishing step is started in a state where a processing liquid supplied in the outer edge removing step remains on the front surface of the first wafer.

2. The wafer processing method according to claim 1, further comprising:
a bonding step of bonding the first wafer and a second wafer having a second wiring layer formed on a front surface thereof to each other,
wherein the first wiring layer and the second wiring layer are joined to each other in the bonding step.

3. The wafer processing method according to claim 2, further comprising:
a back surface grinding step of grinding a back surface of the first wafer to a finish thickness after the bonding step,
wherein a thickness removed from the front surface is deeper than the finish thickness of the first wafer in the outer edge removing step.

4. The wafer processing method according to claim 1,
wherein the polishing step is wet polishing using a polishing liquid.

* * * * *